United States Patent
Suzuki et al.

(10) Patent No.: US 10,462,931 B2
(45) Date of Patent: Oct. 29, 2019

(54) HEAT EXCHANGER

(71) Applicant: DENSO CORPORATION, Kariya, Aichi-pref. (JP)

(72) Inventors: Yuki Suzuki, Kariya (JP); Tomohiro Shimazu, Kariya (JP); Yasuhiro Mizuno, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 59 days.

(21) Appl. No.: 15/516,915

(22) PCT Filed: Aug. 18, 2015

(86) PCT No.: PCT/JP2015/004098
§ 371 (c)(1),
(2) Date: Apr. 5, 2017

(87) PCT Pub. No.: WO2016/067501
PCT Pub. Date: May 6, 2016

(65) Prior Publication Data
US 2017/0311480 A1    Oct. 26, 2017

(30) Foreign Application Priority Data
Oct. 28, 2014   (JP) ................................. 2014-219292

(51) Int. Cl.
*F28F 3/08*      (2006.01)
*H05K 7/20*     (2006.01)
(Continued)

(52) U.S. Cl.
CPC ......... *H05K 7/20263* (2013.01); *F28F 3/025* (2013.01); *F28F 3/08* (2013.01);
(Continued)

(58) Field of Classification Search
CPC ...... H05K 7/20263; F28F 3/025; F28F 3/027; F28F 3/046; F28F 3/08; F28F 3/086;
(Continued)

(56) References Cited

U.S. PATENT DOCUMENTS 5,709,264 A * 1/1998 Sweeney ................ B01D 1/221
165/115
6,935,416 B1 * 8/2005 Tsunoda ................ F28D 9/0018
165/166

(Continued)

FOREIGN PATENT DOCUMENTS

| JP | 2002026215 A | 1/2002 |
| JP | 2007053307 A | 3/2007 |
| JP | 2013065609 A | 4/2013 |

*Primary Examiner* — Filip Zec
(74) *Attorney, Agent, or Firm* — Harness, Dickey & Pierce, P.L.C.

(57) ABSTRACT

A heat exchanger has a tube and an inner fin. A heat medium exchanging heat with a heat exchange target flows in the tube, and the tube has a flat shape in cross section perpendicular to a flow direction of the heat medium. The inner fin has first fins and second fins. The second fins are formed parallel to the flow direction in at least one of an upstream end portion located on an upstream side of an area, in which the first fins are formed, in the flow direction or a downstream end portion located on a downstream side of the area in the flow direction. Fin pitches between the first fins are all identical with each other. At least one of fin pitches between the second fins is different from other fin pitches between the second fins.

3 Claims, 9 Drawing Sheets

(51) Int. Cl.
*H01L 23/473* (2006.01)
*F28F 3/02* (2006.01)
*H01L 23/367* (2006.01)

(52) U.S. Cl.
CPC ....... *H01L 23/473* (2013.01); *H05K 7/20254* (2013.01); *H05K 7/20927* (2013.01); *H01L 23/3672* (2013.01); *H01L 2924/0002* (2013.01)

(58) Field of Classification Search
CPC .......... F28F 9/0282; F28F 9/026; F28F 9/028; F28F 2215/04; F28F 1/40; F28D 1/0316; F28D 1/0325; F28D 1/0366; F28D 1/0375
USPC ........................................................ 165/80.4
See application file for complete search history.

(56) References Cited

U.S. PATENT DOCUMENTS

| | | | |
|---|---|---|---|
| 8,320,127 B2* | 11/2012 | Leutwein | H05K 7/20918 165/185 |
| 2001/0033477 A1 | 10/2001 | Inoue et al. | |
| 2003/0090873 A1 | 5/2003 | Ohkouchi | |
| 2003/0154724 A1* | 8/2003 | Urch | F24F 12/006 62/3.2 |
| 2004/0144996 A1 | 7/2004 | Inoue | |
| 2005/0040515 A1 | 2/2005 | Inoue et al. | |
| 2006/0120047 A1 | 6/2006 | Inoue | |
| 2006/0219396 A1* | 10/2006 | Abei | F28D 1/0333 165/164 |
| 2006/0232939 A1 | 10/2006 | Inoue | |
| 2007/0039717 A1 | 2/2007 | Inagaki et al. | |
| 2009/0145581 A1* | 6/2009 | Hoffman | F28F 1/40 165/80.3 |
| 2010/0139631 A1* | 6/2010 | Geskes | F28F 1/40 123/568.12 |
| 2010/0172091 A1* | 7/2010 | Nishiura | H01L 23/3735 361/689 |
| 2010/0276135 A1* | 11/2010 | Morino | B23P 15/26 165/185 |
| 2011/0011570 A1* | 1/2011 | Levings | F28D 7/1684 165/166 |
| 2011/0132570 A1* | 6/2011 | Wilmot | B64D 13/00 165/41 |
| 2014/0262188 A1* | 9/2014 | Sistla | F28F 17/005 165/182 |
| 2015/0189791 A1* | 7/2015 | Tamura | B23P 15/26 165/148 |

\* cited by examiner

HEAT EXCHANGER

CROSS REFERENCE TO RELATED APPLICATIONS

This application is a U.S. National Phase Application under 35 U.S.C. 371 of International Application No. PCT/JP2015/004098 filed on Aug. 18, 2015 and published in Japanese as WO 2016/067501 A1 on May 6, 2016. This application is based on and claims the benefit of priority from Japanese Patent Application No. 2014-219292 filed on Oct 28, 2014. The entire disclosures of all of the above applications are incorporated herein by reference.

TECHNICAL FIELD

The present disclosure relates to a heat exchanger.

BACKGROUND ART

Conventionally, a liquid-cooled heat sink is known to have two plates that have a plate shape and are liquid-tightly brazed with each other on a condition of being coupled face to face. The liquid-cooled heat sink therein houses a herringbone type fin configured by vertical ribs, and tip portions of the vertical ribs are bent such that a flow rate of a cooling liquid flowing in each portion of the fin becomes uniform (refer to Patent Literature 1 etc.).

PRIOR ART LITERATURES

Patent Literature

Patent Literature 1: JP 2013-65609 A

SUMMARY OF INVENTION

The apparatus disclosed in Patent Literature 1 is designed such that the flow rate of the cooling liquid flowing in each portion of the fin is rendered uniform by bending the tip portions of the vertical ribs configuring the herringbone type fin. However, a heat exchange performance (such as a cooling performance) may deteriorate when a distributivity of the flow rate of the cooling water varies.

Moreover, in the apparatus described in Patent Literature 1, since dimensions between adjacent two of the tip portions of the vertical ribs are equal to each other, it is impossible to improve heat exchange performance in, for example, a specific portion.

The heat exchange performance can be improved by changing a shape of the fin in a main cooling area, e.g., by increasing a size of an inner fin in the main cooling area, however the apparatus may lack versatility when the shape of the fin in the main cooling area is changed.

The present disclosure addresses the above issues, and it is an object of the present disclosure to provide a heat exchanger that can improve heat exchange performance in a specific portion without changing the shape of a fin in a main cooling area.

A heat exchanger of the present disclosure has a tube and an inner fin having a plate shape. A heat medium that exchanges heat with a heat exchange target flows in the tube, and the tube has a flat shape in cross section perpendicular to a flow direction of the heat medium. The inner fin is disposed in the tube and increases a heat transfer area in which heat transfers to and from the heat medium. The inner fin has first fins and second fins. The first fins divide a main passage, in which the heat medium flows, into narrow passages. The second fins are formed parallel to the flow direction in at least one of an upstream end portion located on an upstream side of an area, in which the first fins are formed, in the flow direction or a downstream end portion located on a downstream side of the area in the flow direction. Fin pitches between the first fins are all identical with each other. At least one of fin pitches between the second fins is different from other fin pitches between the second fins.

With this configuration, the inner fin has the first fins and the second fins. Fin pitches between the first fins are all identical while one of fin pitches between the second fins is different from the other fin pitches between the second fins. Accordingly, heat exchange performance in a specific portion can be improved without changing a fin shape in a main cooling area.

BRIEF DESCRIPTION OF DRAWINGS

The above and other objects, features and advantages of the present disclosure will become more apparent from the following detailed description made with reference to the accompanying drawings. In the drawings.

DESCRIPTION OF EMBODIMENTS

Embodiments of the present disclosure will be described referring to drawings. In the embodiments, a part that corresponds to or equivalents to a matter described in a preceding embodiment may be assigned with the same reference number, and descriptions of the part may be omitted. When only a part of a configuration is described in an embodiment, parts described in preceding embodiments may be applied to the other parts of the configuration.

(First Embodiment)

The present embodiment describes an example of a configuration of a cooler that cools electronic components 2, which are "heat exchange targets", by a stack type heat exchanger 1 configured with a heat exchanger of the present disclosure.

Figure 1:
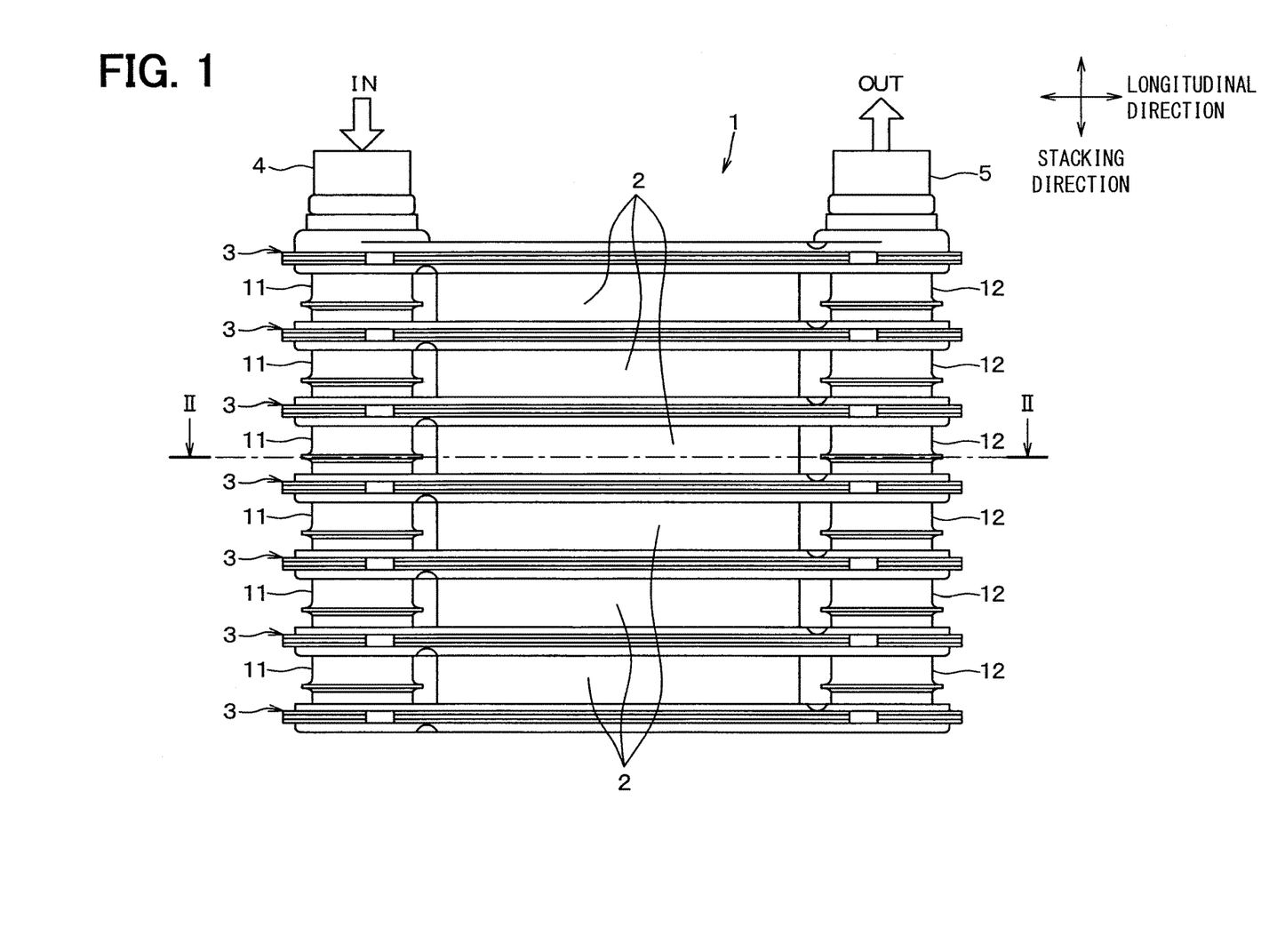
FIG. 1 is a front view illustrating a stack type heat exchanger according to a first embodiment.
Figure 2:
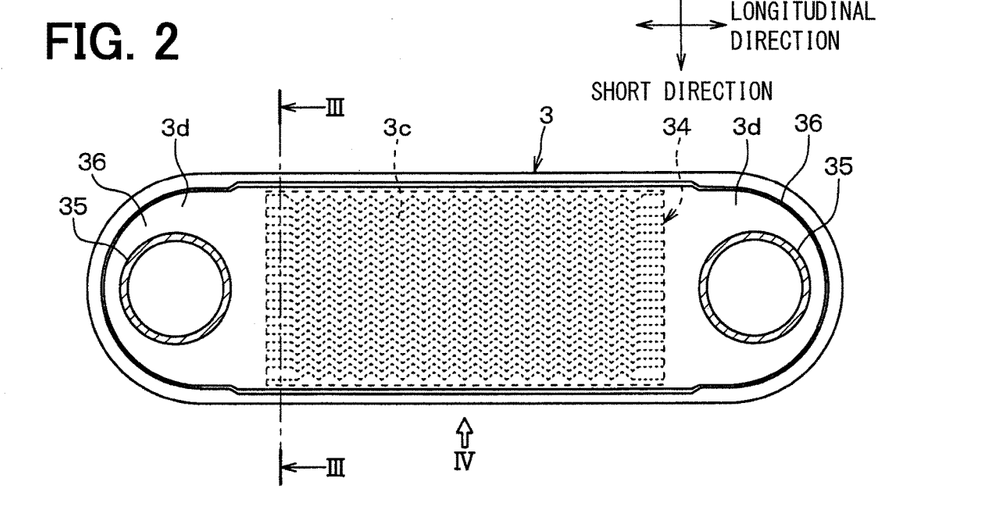
FIG. 2 is a sectional view taken along a line II-II in FIG. 1.
Figure 3:
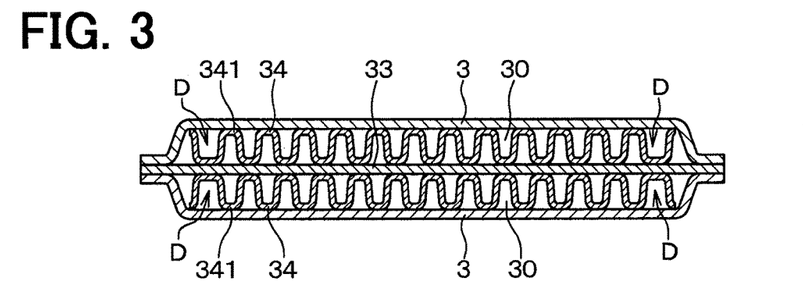
FIG. 3 is a sectional view taken along a line III-III in FIG. 2.

As shown in FIGS. 1 and 2, a heat medium that exchanges heat with the electronic components 2 flows in the stack type heat exchanger 1. The stack type heat exchanger 1 has tubes 3 each of which has a flat shape in cross section perpendicular to the flow direction of the heat medium. The tubes 3 are stacked such that the electronic components 2 are disposed in a space defined between adjacent two of the tubes 3. FIG. 2 is a sectional view taken along a line II-II in FIG. 1. In FIG. 2, the electronic components 2 are not shown for clearly illustrating a shape of the tubes 3. In addition, an inner fin 34 housed in the tube 3 is indicated by dotted lines in FIG. 2. FIG. 3 is a sectional view taken along a line III-III in FIG. 2. The heat exchanger of the present disclosure has the tubes 3, in which a heat medium that exchanges heat with the electronic components 2 flows, and inner fins 34 housed in the tubes 3.

As shown in FIG. 2, each of the tubes 3 has a pair of edges facing each other in a short direction and a pair of edges facing each other in a longitudinal direction. The pair of edges facing each other in the short direction extends in the longitudinal direction. The pair of edges facing each other in the longitudinal direction has an arc shape in a semicircle.

The tubes 3 of the present embodiment are configured by stacking metal plates made of metal, such as aluminum or copper, having a high thermal conductivity and by coupling the metal plates with each other. Specifically, the tubes 3 have a pair of outer shell plates 31, 32, an intermediate plate 33 arranged between the pair of outer shell plates 31, 32, and two inner fins 34 having a corrugated shape and arranged between the intermediate plate 33 and the outer shell plate 31 and between the intermediate plate 33 and the outer shell plate 32 respectively.

A medium passage 30 in which a heat medium flows is formed between the outer shell plates 31, 32 and the intermediate plate 33. As a heat medium, for example, water mixed with an ethylene-glycol-based antifreeze, or a natural refrigerant such as water or ammonia, can be used.

The pair of outer shell plates 31, 32 is plate members that configure an outer shell of the tube 3. The pair of outer shell plates 31, 32 are joined by a brazing material disposed on the inside of the peripheral edges. The brazing material disposed on the inside of outer shell plates 31, 32 is used also to join the intermediate plate 33 and the inner fins 34 to the outer shell plates 31, 32. In addition, the edges of the tube 3 are coupling portions in which the pair of outer shell plates 31, 32 are coupled with each other by a brazing material, or the like.

The intermediate plate 33 is a rectangular plate member and joined to the pair of outer shell plates 31, 32 via the inner fins 34. Although not shown, the intermediate plate 33 is provided with circular openings corresponding to protruding pipe portions 35, which will be described later. A rim of the intermediate plate 33 may be interposed and supported between the pair of outer shell plates 31, 32.

The inner fins 34 are members that increase a heat transfer area between the electronic components 2 and the heat medium that flows in the medium passage 30. The inner fins 34 are configured by a meal plate made of metal, such as aluminum, having a high thermal conductivity by a method such as press-working. The configuration of the inner fins 34 of the present embodiment will be described in detail below.

Figure 4:
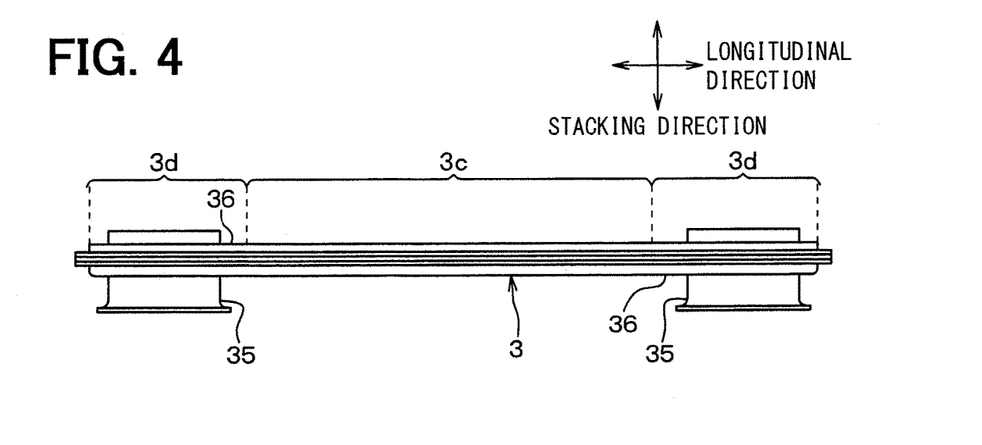
FIG. 4 is a view illustrating a tube when viewed in a direction shown by an arrow IV in FIG. 2.

As shown in FIG. 4, the protruding pipe portions 35 are provided on both sides of the tube 3 in the longitudinal direction. The protruding pipe portions 35 are open in the stacking direction and protrude in the stacking direction. Adjacent tubes 3 are coupled in a manner that the protruding pipe portions 35 are fit to each other, and that side walls of the protruding pipe portions 35 are joined with each other. Respective one of the tubes 3 other than a pair of outermost tubes 3 located at an outermost end in the stacking direction has a pair of the protruding pipe portions 35 that is provided in each of opposed surfaces of the respective one of the tubes 3 facing another one of the tubes 3 adjacent to each other. On the other hand, the pair of outermost tubes 3 located at the outermost end in the stacking direction has the pair of protruding pipe portion 35 in only one surface facing another one of the tubes 3 adjacent to each other.

Medium passages 30 of adjacent tubes 3 communicate with each other by joining the protruding pipe portions 35. One of the pair of protruding pipe portions 35 functions as a supply header part 11 that supplies the heat medium to the medium passage 30 of the tubes 3, and the other of the pair of protruding pipe portions 35 functions as a discharge header part 12 that discharges the heat medium from the medium passage 30 of the tubes 3.

The tube 3 is roughly divided into a contact surface 3c and parts 3d. The contact surface 3c is in contact with the electronic components 2, and configures a heat exchange area for exchanging heat between the electronic components 2 and the heat medium flowing in the medium passage 30. The parts 3d configure the supply header part 11 and the discharge header part 12.

Returning to FIG. 1, one of the pair of outermost tubes 3 of the tubes 3 has a medium introduction part 4 and a medium discharge part 5 in both end portions in the longitudinal direction respectively. The medium introduction part 4 introduces the heat medium into the stack type heat exchanger 1, and the medium discharge part 5 guides the heat medium to flow out of the stack type heat exchanger 1. The medium introduction part 4 and the medium discharge part 5 are coupled to the one of the pair of outermost tubes 3 by a method such as brazing.

Figure 5:
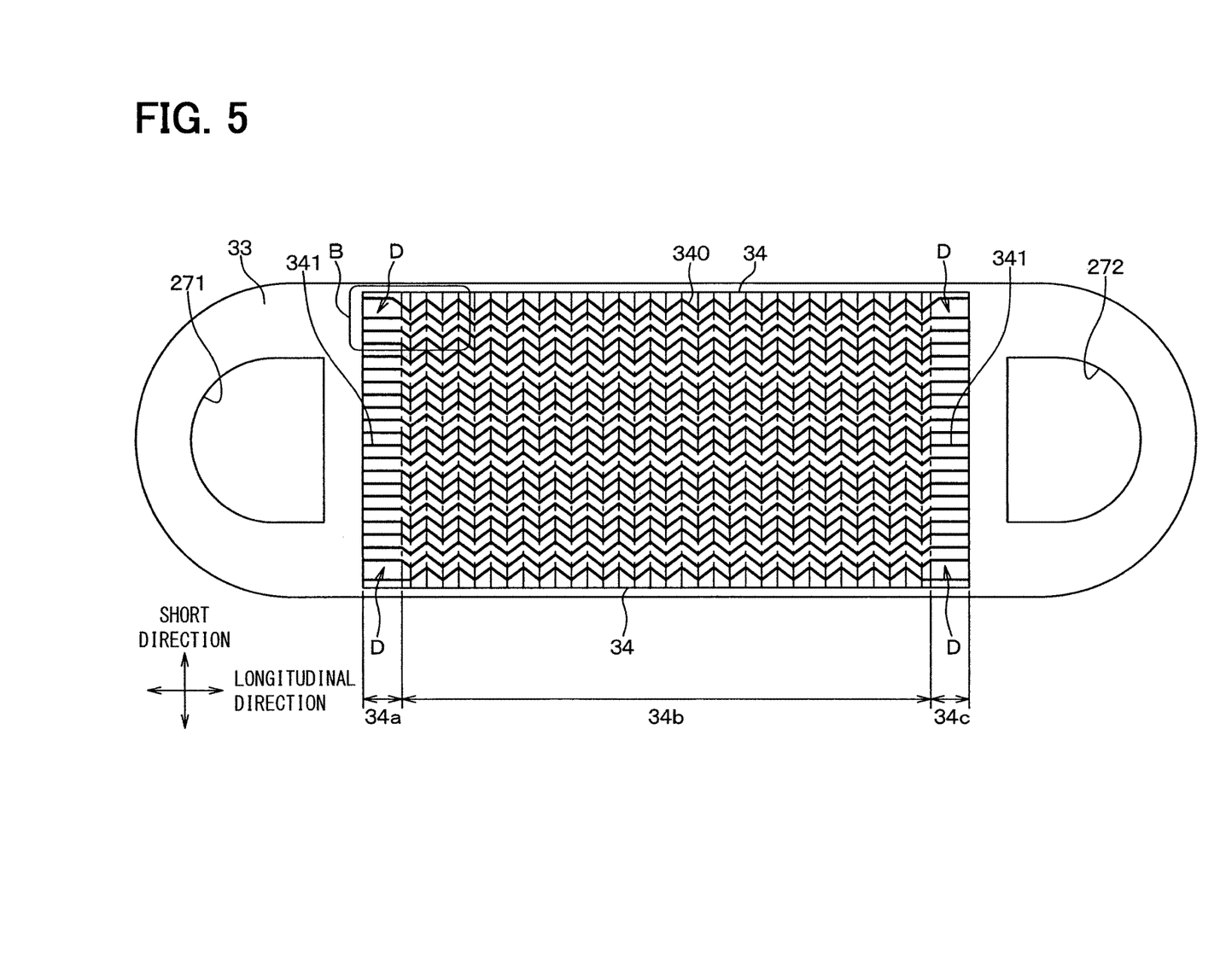
FIG. 5 illustrating an inner fin mounted on a side adjacent to one surface of an intermediate plate of the heat exchanger according to the first embodiment.
Figure 6:
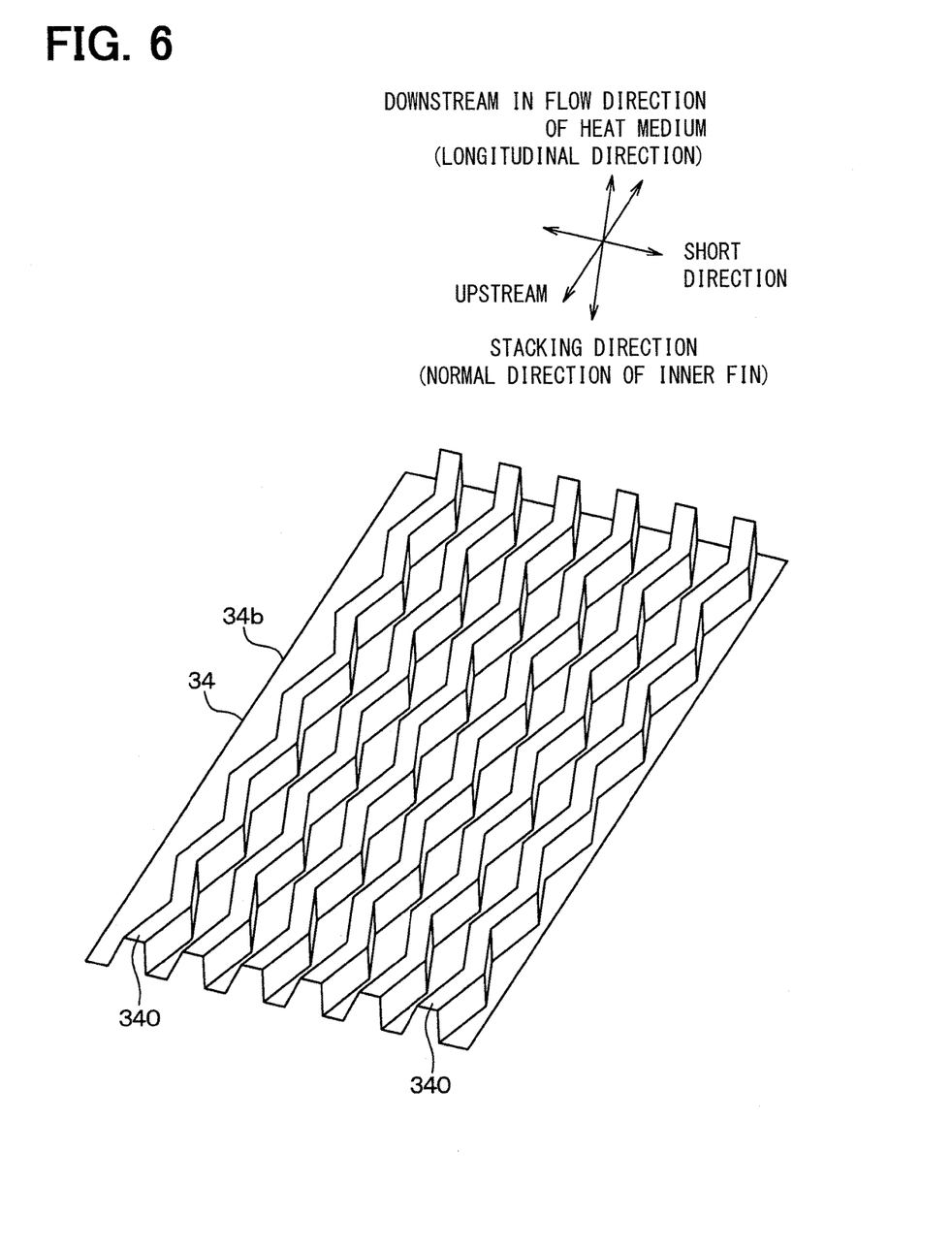
FIG. 6 is a perspective view illustrating an area in which first fins of the inner fin of the heat exchanger is formed, according to the first embodiment.
Figure 7:
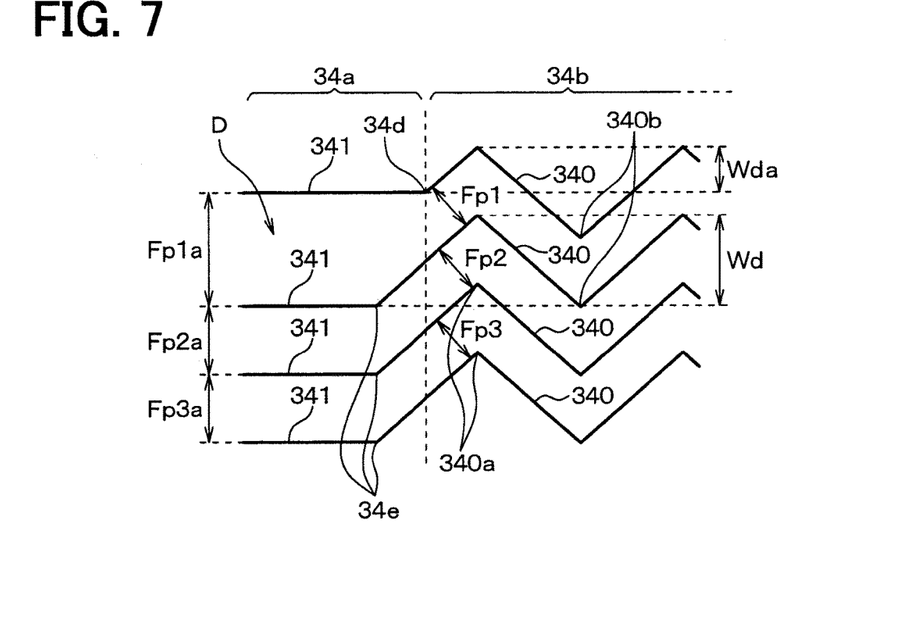
FIG. 7 is a diagram schematically illustrating a section B shown in FIG. 5.

Next, a configuration of an inner fin 34 of the heat exchanger according to the present embodiment will be described referring to FIG. 5 to FIG. 7. FIG. 5 shows a state in which an inner fin 34 is mounted on one surface of the intermediate plate 33. FIG. 6 is a perspective view illustrating an area 34b in which the first fins 340 of the inner fin 34 are formed. FIG. 7 is a diagram schematically illustrating the section B in FIG. 5.

As shown in FIG. 5, each inner fin 34 of the present embodiment has first fins 340 and second fins 341. The first fins 340 divide a main passage, in which the heat medium flows, into narrow passages. The second fins 341 are formed in an upstream end portion 34a located on the upstream side, in the flow direction of the heat medium, of the area 34b in which the first fins 340 are formed and in a downstream end portion 34c located on the downstream side of the area 34b in the flow direction, such that the second fins are parallel to the flow direction of the heat medium.

As shown in FIG. 6, the first fins 340 have a corrugated shape in a cross section perpendicular to the longitudinal direction of the tubes 3 (i.e., the flow direction of the heat medium), and are bent to have a triangle wave shape (i.e., a waved shape) continuing in the flow direction of the heat medium when viewed in the stacking direction. The stacking direction of the tubes 3 is the normal direction of the inner fins 34 in other words.

As shown in FIG. 3, the second fins 341 have a waved shape in a cross section perpendicular to the longitudinal direction of the tubes 3, and have a linear shape when viewed in the stacking direction of the tubes 3.

In each inner fin 34, the second fins 341 connected to the upstream end portion 34a, the first fins 340, and the second fins 341 connected to the downstream end portion 34c are continuously connected to configure a single fin.

As shown in FIG. 7, all fin pitches between the first fins 340 formed the inner fins 34 are the same. Specifically, as shown in FIG. 7, an equation of Fp1=Fp2=Fp3 is satisfied, to which Fp1 is defined as a dimension between an uppermost one of the first fins 340 and a second one of the first fins 340 from the top, Fp2 is defined as a dimension between the second one of the first fins 340 and a third one of the first fins 340 from the top, and Fp3 is defined as a dimension between the third one of the first fins 340 and a fourth one of the first fins 340 from the top.

On the other hand, in the upstream end portion 34a of each inner fin 34 and in the downstream end portion 34c of the inner fin 34, some fin pitches between the second fins 341 differ from the other fin pitches.

Specifically, as shown in FIG. 5, the upstream end portion 34a has portions (i.e., a large width portion) D respectively between an uppermost one of the second fins 341 and a second one of the second fins 341 from the top and between a lowermost one of the second fins 341 and a second one of the second fins 341 from the bottom. One fin pitch between adjacent second fins 341 in the portion D is larger than other fin pitches between the second fins 341.

Similarly, as shown in FIG. 5, the downstream end portion 34c has the portions D respectively between the uppermost one of the second fins 341 and the second one of the second fins 341 from the top and between the lowermost one of the second fins 341 and the second one of the second fins 341 from the bottom. One fin pitch between adjacent second fins 341 in the portion D is larger than other fin pitches between the second fins 341.

As shown in FIG. 7, one of the first fins 340 and corresponding one of the second fins 341 are connected to each other at a connection point 34d in the portion (i.e., the large width portion) D in which one fin pitch between adjacent second fins 341 that is larger than other fin pitches between the second fins 341 is defined. The connection point 34d is located at a location at which a width Wda of the one of the first fins 340 in an amplitude direction (i.e., an amplitude direction of the corrugated shape) is smaller than a largest width Wd in the amplitude direction.

That is, in FIG. 7, each of the second one to the fourth one of the second fins 341 from the top is connected to corresponding one of the first fins 340 at a connection point 34e at which a width of the first fins 340 in the amplitude direction is the largest width Wd. The connection point 34e, at which the width of the first fins 340 in the amplitude direction is the largest width Wd, corresponds to a bottom 340b of the first fins 340 shown in FIG. 7. In contrast, the uppermost one of the second fins 341 is connected to corresponding one of the first fins 340 at the connection point 34d at which the width Wda of the corresponding one of the first fins 340 in the amplitude direction is smaller than the largest width Wd. In FIG. 7, the connection point 34d is located in an intermediate portion between a top 340a and the bottom 340b of the first fins 340 in the amplitude direction.

An equation of $Fp1a \neq Fp2a = Fp3a$ is satisfied in the upstream end portion 34a, to which Fp1a is defined as a dimension between an uppermost one of the second fins 341 and a second one of the second fins 341 from the top, Fp2a is defined as a dimension between the second one of the second fins 341 from the top and a third one of the second fins 341 from the top, Fp3a is defined as a dimension between the third one of the second fins 341 and a fourth one of the second fins 341 from the top.

In the above-described configuration, when the heat medium flows into the tubes 3 from the supply header part 11, a flow rate of the heat medium is distributed by the second fins 341 formed in the upstream end portion 34a. That is, the flow rate of the heat medium flowing into the large-pitch portions of the second fins 341 increases while the flow rate of the heat medium flowing into the narrow-pitch portions of the second fins 341 decreases.

Figure 8:
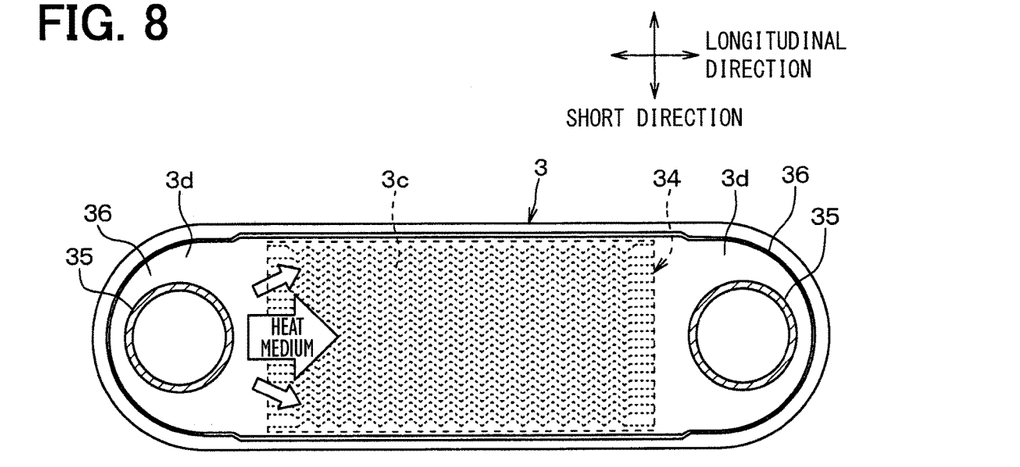
FIG. 8 is a view illustrating an intermediate plate and an inner fin of a heat exchanger when viewed from a normal direction of a contacting surface, according to a second embodiment.

In such a heat exchanger, as shown in FIG. 8, the heat medium tends to pass easily through the middle of each tube 3 in the short direction but not to pass easily through both ends of the tube 3 in the shorter direction. However, in the heat exchanger of the present embodiment, the fin pitches of the second fins 341 at both ends perpendicular to the flow direction of the heat medium are larger than fin pitches of the second fins 341 at the middle portion between the both ends. That is, the heat exchanger of the present embodiment is configured such that, in the upstream end portion 34a and the downstream end portion 34c, the large width portions D are formed at the both ends in a direction perpendicular to the flow direction of the heat medium. Therefore, the heat medium can flow in the tubes 3 uniformly.

According to the above-described configuration, each inner fin 34 has the first fins 340 and the second fins 341. The first fins 340 divide a main passage in which the heat medium flows into narrow passages. The second fins 341 are formed parallel to the flow direction of the heat medium in at least one of the upstream end portion 34a and the downstream end portion 34c. The fin pitches Fp1, Fp2, and Fp3 between the first fins 340 are all identical with each other. Among the fin pitches between the second fins 341, the pitch Fp1a is different from the fin pitches Fp2a, Fp3a between the second fins 341. Accordingly, the heat exchange performance for a specific portion can be improved without changing the fin shape of a main cooling area.

A satisfactory heat exchange performance may not be obtained in a case where the first fins 340 have a linear shape when viewed in the normal direction of the inner fin 34 having a plate shape. A flow resistance of the heat medium may increase in a case where the second fins 341 have a corrugated shape when viewed in the normal direction of the inner fin 34 having the plate shape.

However, according to the above-described configuration, the first fins 340 has the corrugated shape, the second fins 341 have the linear shape, and the second fins 341 are continuously connected to the first fins 340 respectively, when viewed in the normal direction of the inner fin 34 having the plate shape. Accordingly, a satisfactory heat exchange performance can be obtained and resistance to passage of the heat medium can also be reduced.

The heat medium tends to pass easily through the middle of each tube 3 in the short direction but not to pass easily through both ends of the tube 3 in the shorter direction. However, in the above-described configuration, the fin pitches Fp1a of the second fins 341 at the both ends in the direction perpendicular to the flow direction of the heat medium are larger than the fin pitches Fp2a, Fp3a of the second fins 341 at the middle portion between the both ends in the direction perpendicular to the flow direction of the heat medium. Accordingly, the heat medium can flow in the tubes 3 uniformly.

(Second Embodiment)

Figure 9:
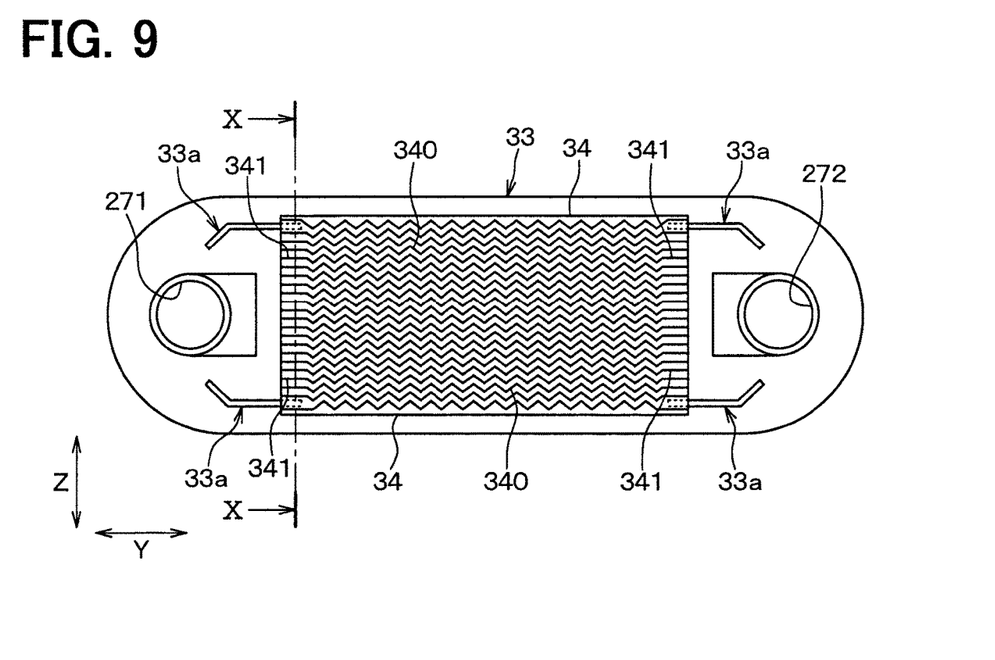
FIG. 9 is a view explaining a heat medium flowing in a tube 3.
Figure 10:
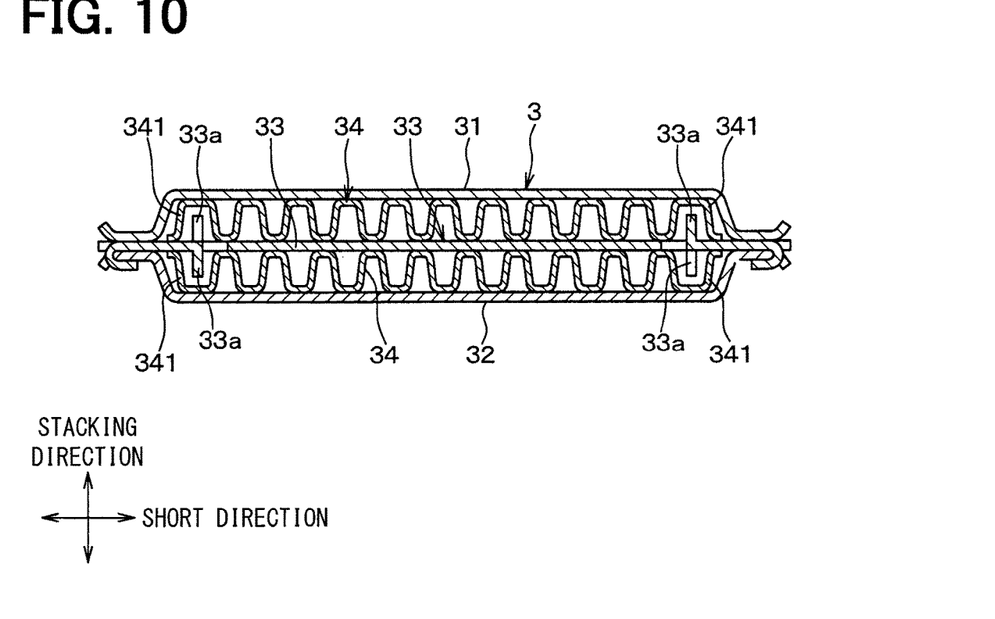
FIG. 10 is a sectional view taken along a line X-X in FIG. 9.

FIG. 9 shows a state in which an inner fin 34 is mounted on one surface of an intermediate plate 33 of a heat exchanger in the second embodiment. FIG. 10 is a sectional view taken along a line X-X in FIG. 9. The inner fins 34 of the heat exchanger of the present embodiment are identical to those shown in FIG. 5. The heat exchanger of the present embodiment is different from the heat exchanger in the above-described first embodiment in a feature that rectifying ribs 33a that adjusts the flow rate of a heat medium are formed on both surfaces of the intermediate plate 33.

In such a heat exchanger, the rectifying ribs 33a are inserted in passages formed in each inner fin 34, and the inner fin 34 is assembled to the intermediate plate 33. Here, when a width of the passages formed in inner fins 34 is too narrow, workability in assembling is low, and it is impossible to insert the rectifying ribs 33a into the passages formed in the inner fins 34 in some cases.

However, in each inner fin 34 of the heat exchanger of the present embodiment, the fin pitches of some of second fins 341 are larger than the fin pitches of the other second fins 341. The rectifying ribs 33a are inserted into the larger fin-pitch portions, and the inner fins 34 are assembled to the intermediate plate 33. Accordingly, the inner fins 34 can be assembled easily to the intermediate plates 33.

In the heat exchanger of the present embodiment, the rectifying rib 33a is inserted into each larger fin-pitch portion between the second fins 341, and each inner fin 34 is assembled to the intermediate plate 33. In addition, the large width portions for improving a heat exchange performance in specific portions may be formed in the inner fins 34, similar to the heat exchanger of the first embodiment.

(Third Embodiment)

Figure 11:
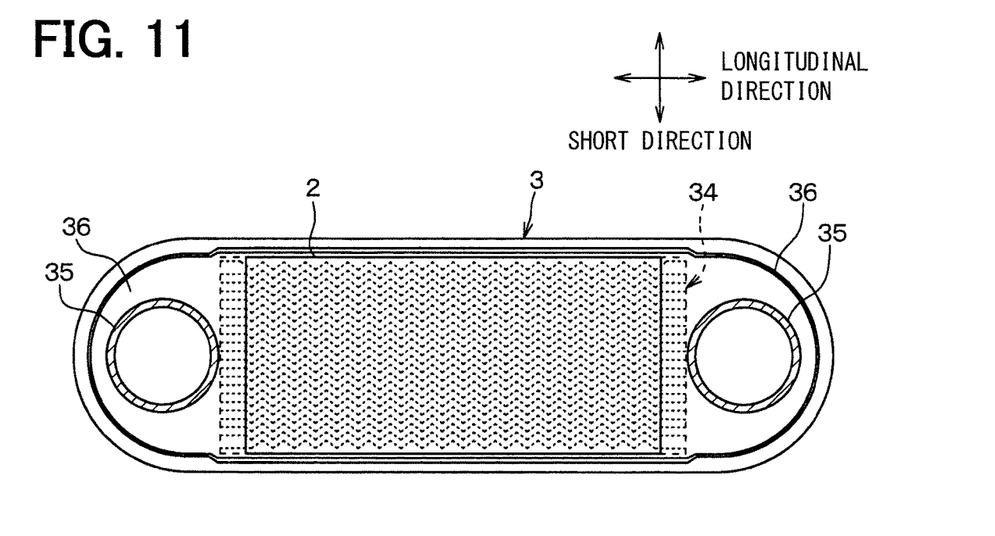
FIG. 11 is a view illustrating a tube of a heat exchanger when viewed in a normal direction of an inner fin, according to a third embodiment of the present disclosure.

FIG. 11 shows a tube 3 of a heat exchanger in the third embodiment, when viewed in the normal direction of inner fins 34. In the drawing, the inner fins 34 housed in the tube 3 are indicated by dotted lines.

An area in which the tube 3 and electronic components 2, which are heat exchange targets, overlap with each other when viewed in the normal line of the inner fins 34 is defined as a cooling area. A cooling performance deteriorates when the second fins 341 are arranged inside the cooling area. A flow resistance of the heat medium increases when the first fins 340 are arranged to extend to an outside of the cooling area.

Then, according to the heat exchanger of the present embodiment, a deterioration of the cooling performance is suppressed by arranging the first fins 340 inside the cooling area, and an increase of the flow resistance of the heat medium is suppressed by arranging the second fins 341 in the outside of the cooling area The tubes 3 may be deformed when an inside pressure in the tubes 3 increases in a case that the tubes 3 therein have a large void. Then, according to the heat exchanger of the present embodiment, the second fins 341 are arranged to extend to neighborhoods of the protruding pipe portions 35 to decrease the void in the tubes 3, and thereby a pressure resistance in the tubes 3 increases.

According to the above-described configuration, the second fins 341 are arranged in the outside of the cooling area when the cooling area is defined as the area in which the tubes 3 and the electronic components 2 (i.e., the heat exchange targets) overlap with each other when viewed in the normal direction of the inner fin 34 having the plate shape. As a result, the flow resistance of the heat medium can be suppressed, and the pressure resistance of the tubes 3 can be improved. Moreover, a satisfactory cooling performance can be obtained since the first fins 340 are arranged inside the cooling area when viewed in the normal direction of the inner fin 34 having the plate shape.

(Fourth Embodiment)

Figure 12:
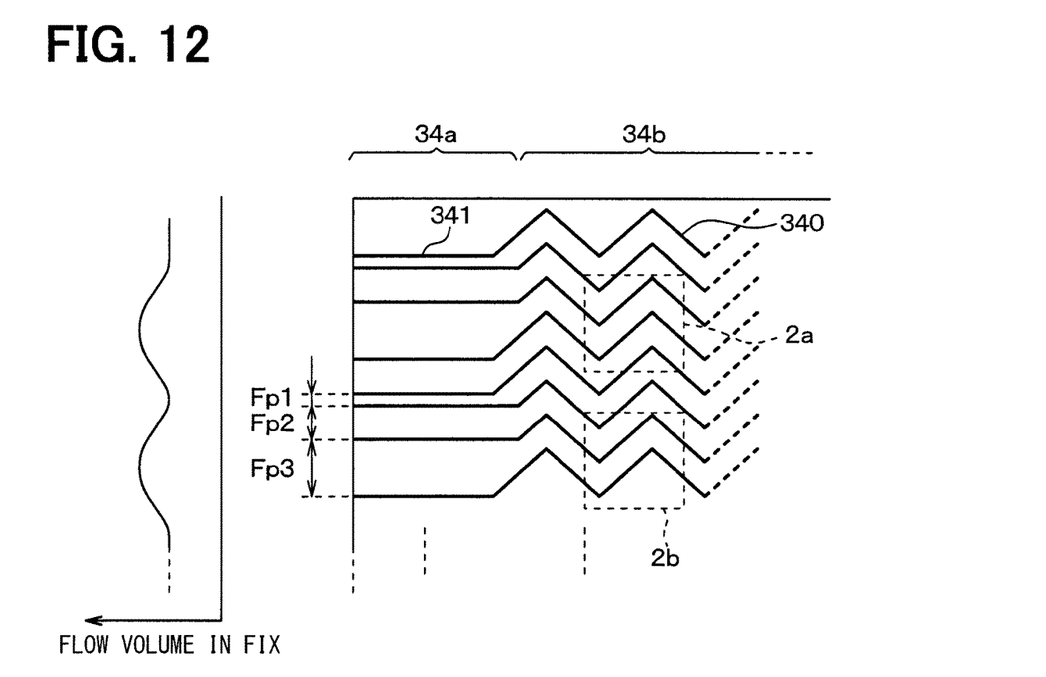
FIG. 12 is a diagram schematically illustrating an inner fin of a heat exchanger according to a fourth embodiment of the present disclosure.

FIG. 12 schematically shows an inner fin 34 of a heat exchanger of the fourth embodiment. According to the above-described embodiment, the large width portion D is provided at each end of the inner fin 34 in the direction perpendicular to the flow direction of the heat medium in each of the upstream end portion 34a and the downstream end portion 34c that are respectively located on the upstream side and the downstream side of the area 34b, in which the first fins 340 are provided, in the flow direction of the heat medium. In contrast, according to the present embodiment, some of fin pitches between second fins 341 are different from the other fin pitches. Accordingly, flow rates of the heat medium in portions of the inner fin 34 that are in contact with electronic components 2a, 2b increase, and thereby the electronic components 2a, 2b are cooled positively.

Specifically, as shown in FIG. 12, the fin pitches of the second fins 341 connected to the first fins 340 located in portions that are in contact with the electronic components 2a, 2b are large so as to increase the flow rates of the heat medium flowing in the first fins 340 in the portions of the first fins 340 that are in contact with the electronic components 2a, 2b. As indicated by Fp1, Fp2, Fp3 in FIG. 12, some fin pitches of the second fins 341 are different from fin pitches of the other second fins 341.

Thus, the flow rate of the heat medium in the portions of the fin 34 that are in contact with the electronic components 2a, 2b as shown in FIG. 12 can be controlled appropriately in a manner that the fin pitches between the second fins 341 connected to the first fins 340 located in the portions that are in contact with the electronic components 2a, 2b, which are targets to be cooled positively, are provided to be different from the other fin pitches.

(Fifth Embodiment)

Figure 13:
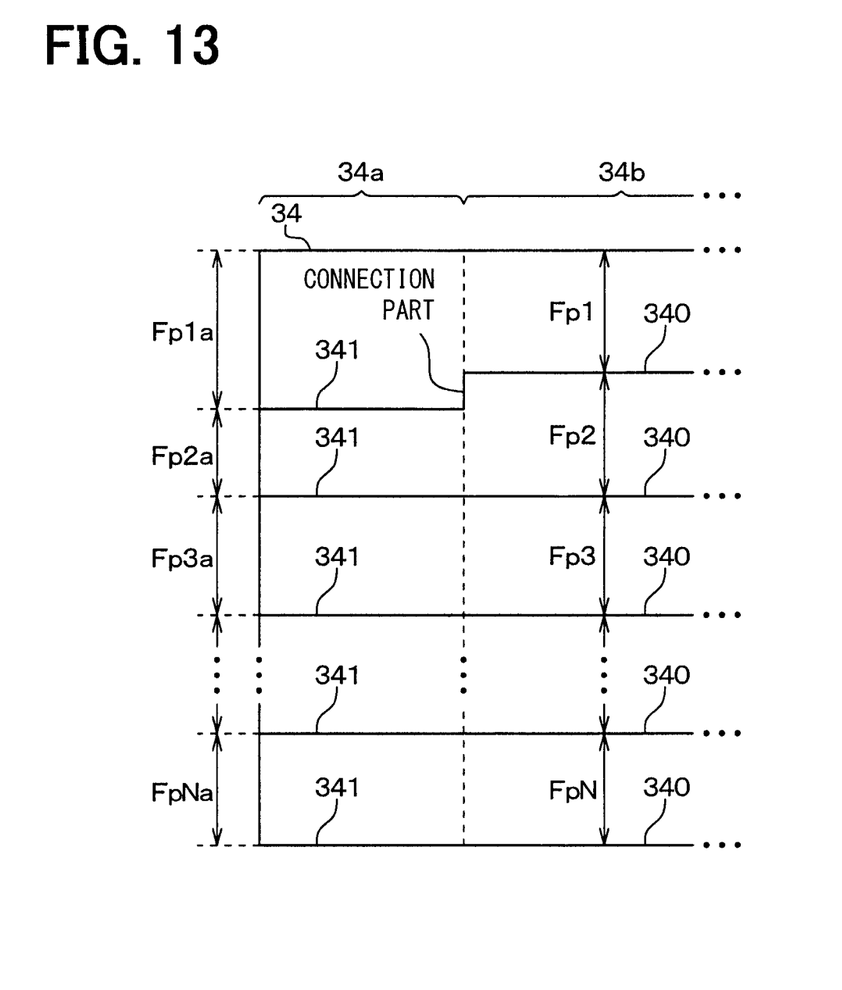
FIG. 13 is a diagram schematically illustrating an inner fin of a heat exchanger according to a fifth embodiment of the present disclosure.

FIG. 13 schematically shows an inner fin 34 for a heat exchanger according to the fifth embodiment. According to the above-described first embodiment, the first fins 340 have the corrugated shape when viewed in the stacking direction of the tubes 3 (i.e., the normal direction of the inner fins 34). In contrast, the first fins 340 of the present have a linear shape when viewed in the stacking direction of the tubes 3 according to the present embodiment.

As shown in FIG. 13, an equation of $Fp1=Fp2=Fp3=FpN$ is satisfied, when Fp1 is defined as a dimension between an uppermost one of the first fins 340 and a second one of the first fins 340 from the top, Fp2 is defined as a dimension between the second one of the first fins 340 and a third one of the first fins 340 from the top, Fp3 is defined as a dimension between the third one of the first fins 340 and a fourth one of the first fins 340 from the top, and FpN is defined as a dimension between an Nth one of the first fins 340 from the top and an (N+1)th one of the first fins 340 from the top.

The second fins 341 are provided in the upstream end portion 34a located on the upstream side of the area 34b in which the first fins 340 are provided. Each of the second fins 341 has a linear shape when viewed from the stacking direction of the tubes 3.

An equation of $Fp1a \neq Fp2a \neq Fp3a = FpNa$ is satisfied as shown in FIG. 13, when Fp1a is defined as a dimension between an uppermost one of the second fins 341 and a second one of the second fins 341 from the top, Fp2a is defined as a dimension between the second one of the second fins 341 and a third one of the second fins 341 from the top, Fp3a is defined as a dimension between the third one of the second fins 341 and a fourth one of the second fins 341 from the top, and FpNa is defined as a dimension between an Nth one of the second fins 341 from the top and an (N+1)th one of the second fins 341.

The same effects as the above-described first embodiment can be obtained according to the above-described configuration in which the first fins 340 have a linear shape when viewed in the stacking direction of the tubes 3, and in which at least one of the fin pitches between the second fins 341 is different from the rest of the fin pitches in the upstream end portion 34a of the inner fin 34.

(Sixth Embodiment)

Figure 14:
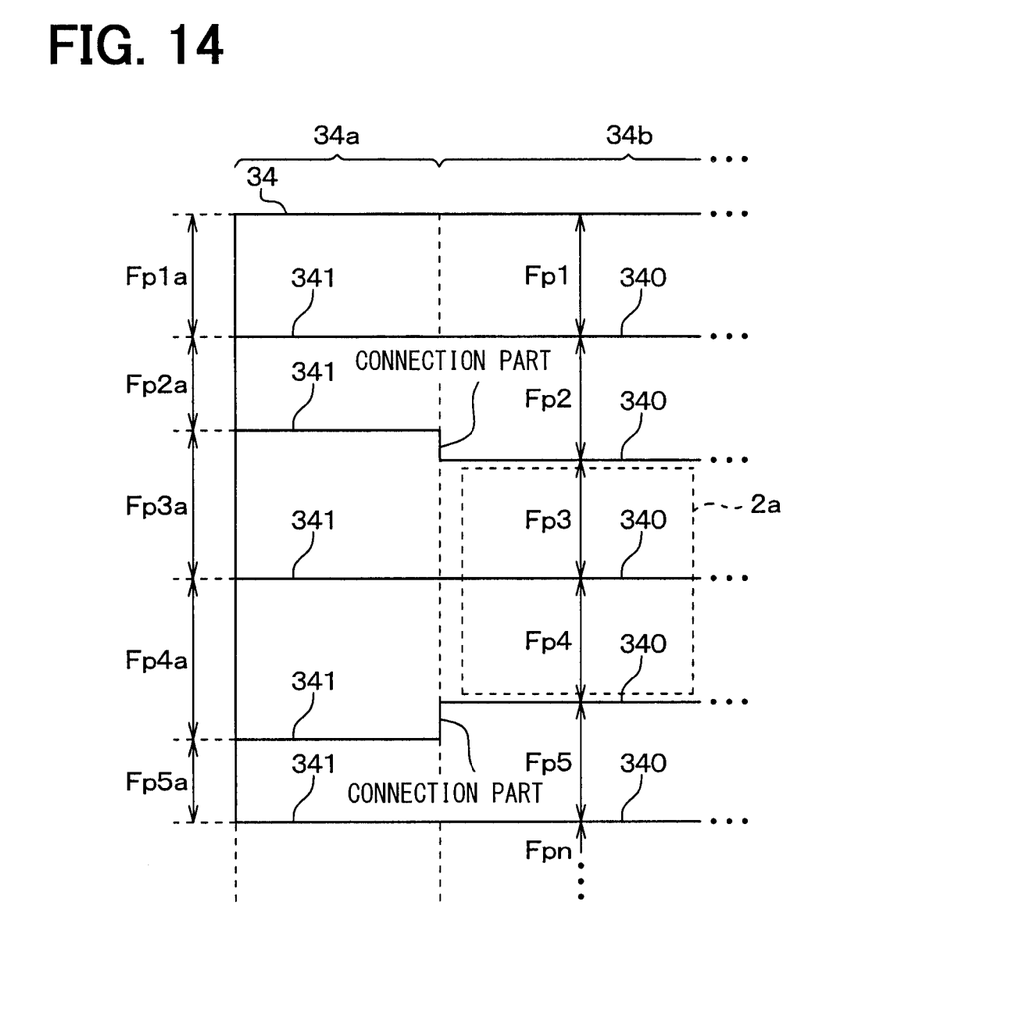
FIG. 14 is a diagram schematically illustrating an inner fin of a heat exchanger according to a sixth embodiment of the present disclosure.

FIG. 14 schematically shows an inner fin 34 for a heat exchanger according to the sixth embodiment. The first fins 340 of the present embodiment has a linear shape when viewed in the stacking direction of the tubes 3 (i.e., the normal direction of the inner fin 34) similar to the above-described fifth embodiment.

According to the present embodiment, some of the fin pitches between the second fins 341 are different from the other fin pitches between the other second fins 341 so as to increase a flow rate of the heat medium in portions of the inner fin that are in contact with an electronic component 2a, in order to cool the electronic component 2a positively.

In FIG. 14, a fin pitch Fp1a is defined as a dimension between an uppermost one of the second fins 341 and a second one of the second fins 341 from the top, a fin pitch Fp2a is defined as a dimension between the second one of the second fins 341 and a third one of the second fins 341 from the top, a fin pitch Fp3a is defined as a dimension between the third one of the second fins 341 and a fourth one of the second fins 341 from the top, a fin pitch Fp4a is defined as a dimension between the fourth one of the second fins 341 and a fifth one of the second fins 341 from the top, and a fin pitch Fp5a is defined as a dimension between the fifth one of the second fins 341 and a sixth one of the second fins 341 from the top. As shown in FIG. 14, both of the fin pitch Fp3a and the fin pitch Fp4a are larger than each of the fin pitch Fp1a, the fin pitch Fp2a, and the fin pitch Fp5a.

The same effects as the above-described first embodiment can be obtained according to the above-described configuration in which the first fins 340 have a linear shape when viewed in the stacking direction of the tubes 3, and in which at least one of the fin pitches between the second fins 341 is different from the other fin pitches in the upstream end portion 34a of the inner fin 34.

In addition, the flow rate of the heat medium in the portions of the inner fin 34 that are in contact with the electronic component 2a can be controlled appropriately in a manner that the fin pitches between the second fins 341 connected to the first fins 340 located in the portions that are in contact with the electronic component 2a, which is a target to be cooled positively, are provided to be different from the other fin pitches.

(Other Embodiments)

A configuration in which the heat exchanger of the present disclosure cools the electronic component 2 as the heat exchange target is described in the above-described first through sixth embodiments, however a configuration in which the heat exchanger of the present disclosure heats a heat transfer target may be provided.

According to the above-described first through fourth embodiments, the second fins 341 are provided in both of the upstream end portion 34a and the downstream end portion 34c of the inner fin 34. However, the second fins 341 may be provided in one of the upstream end portion 34a and the downstream end portion 34c.

According to the above-described five and sixth embodiments, the second fins 341 are provided in the upstream end portion 34a of the inner fin 34. However, the second fins 341 may be provided in both of the upstream end portion 34a and the downstream end portion 34c.

According to the above-described first through sixth embodiments, all of the second fins 341 of the inner fin 34 are continuously connected to the first fins 340 respectively. However, it is not necessary all of the second fins 341 are connected to all of the first fins 340 respectively, and a part of the second fins 341 may not be connected to the first fins 340.

The present disclosure is not limited to the above-described embodiments and can be modified within the scope of the present disclosure as defined by the appended claims. The above-described embodiments are not unrelated to each other and can be combined with each other except for a case where the combination is clearly improper.

In the above-described embodiments, it is to be understood that elements constituting the embodiments are not necessary except for a case of being explicitly specified to be necessary and a case of being considered to be absolutely necessary in principle.

Even when a factor such as a quantity of elements, a value, an amount, a range is mentioned in the above-described embodiments, it is to be understood that the factor is not limited to a specific value except for a case of being explicitly specified to be necessary and a case of being considered to be absolutely necessary in principle.

Even when a feature such as a material forming a member, a shape of a member, a positional relation of members, it is to be understood that such feature is not limited to a specific material, shape, positional relation, or the like except for a case of being explicitly specified to be necessary and a case of being considered to be absolutely necessary in principle.

What is claimed is:

1. A heat exchanger comprising:
a tube in which a heat medium that exchanges heat with a heat exchange target flows, the tube having a flat shape in cross section taken along a particular direction perpendicular to a flow direction of the heat medium; and
an inner fin plate that is disposed inside the tube and has a heat transfer area in which heat transfers to and from the heat medium, wherein
the inner fin plate has a corrugated fin shape having a plurality of fins arranged along the particular direction to define a plurality of narrow passages therebetween through which the heat medium flows,
each of the plurality of fins includes a first fin element and a second fin element, the second fin element being positioned at least one of upstream and downstream of the first fin element,
the second fin element of each of the plurality of fins extends along the flow direction,
the plurality of fins includes at least one first fin and other fins in the plurality of fins,
a fin pitch between the first fin element of the at least one first fin and the first fin element of one of the other fins in the plurality of fins that is adjacent to the at least one first fin is equal to a fin pitch between adjacent first fin elements of the other fins in the plurality of fins, a fin pitch between the second fin element of the at least one first fin and the second fin element of the one of the other fins in the plurality of fins that is adjacent to the at least one first fin is different from a fin pitch between adjacent second fin elements of the other fins in the plurality of fins, the first fin element of each of the plurality of fins has a corrugated shape, the second fin element of each of the plurality of fins has a linear shape, the second fin element of each of the plurality of fins is continuously connected to the corresponding first fin element of each of the plurality of fins, when viewed in a normal direction of the inner fin plate, the fin pitch between the second fin element of the at least one first fin and the second fin element of the one of the other fins in the plurality of fins that is adjacent to the at least one first fin is greater than the fin pitch between adjacent second fin elements of the other fins in the plurality of fins, the second fin element of the at least one first fin is connected to the first fin element of the at least one first fin at a first connection point, the second fin element of each of the other fins in the plurality of fins is connected to the corresponding first fin element of each of the other fins in the plurality of fins at an other connection point, the first fin element of the at least one first fin has a first amplitude along the particular direction at the first connection point, the first fin element of each of the other fins in the plurality of fins has an other amplitude along the particular direction at the other connection point, and the first amplitude of the first fin element of the at least one first fin is less than the other amplitude of the first fin element of each of the other fins in the plurality of fins.

2. The heat exchanger according to claim 1, wherein
the at least one first fin includes a first outermost fin and a second outermost fin that are positioned on both ends of the inner fin plate in the particular direction, and the fin pitch between the second fin element of each of the first and second outermost fins and the second fin element of each corresponding one of the other fins in the plurality of fins that is adjacent to each corresponding one of the first and second outermost fins is greater than the fin pitch between the second fin elements of the other fins in the plurality of fins.

3. The heat exchanger according to claim 1, wherein
the second fin element of each of the plurality of fins is arranged outside a cooling area in which the tube and the heat exchange target overlap with each other when viewed in a normal direction of the inner fin plate.

* * * * *